United States Patent
Bayn et al.

(10) Patent No.: US 9,978,890 B1
(45) Date of Patent: May 22, 2018

(54) GERMANIUM MULTI-DIRECTIONAL DETECTOR

(71) Applicant: Cisco Technology, Inc., San Jose, CA (US)

(72) Inventors: Igal I. Bayn, New York, NY (US); Vipulkumar Patel, Breinigsville, PA (US); Sean P. Anderson, Macungie, PA (US); Prakash Gothoskar, Allentown, PA (US)

(73) Assignee: Cisco Technology, Inc., San Jose, CA (US)

( * ) Notice: Subject to any disclaimer, the term of this patent is extended or adjusted under 35 U.S.C. 154(b) by 0 days. days.

(21) Appl. No.: 15/440,209

(22) Filed: Feb. 23, 2017

(51) Int. Cl.
| | |
|---|---|
| *H01L 31/00* | (2006.01) |
| *H01L 31/0232* | (2014.01) |
| *H01L 31/105* | (2006.01) |
| *H01L 31/0352* | (2006.01) |
| *G02B 6/125* | (2006.01) |
| *G02B 6/12* | (2006.01) |

(52) U.S. Cl.
CPC ........... *H01L 31/0232* (2013.01); *G02B 6/12* (2013.01); *G02B 6/125* (2013.01); *H01L 31/03529* (2013.01); *H01L 31/105* (2013.01); *G02B 2006/12061* (2013.01)

(58) Field of Classification Search
CPC ........... H01L 31/0232; H01L 31/0352; H01L 31/03529; G02B 6/12; G02B 6/125; G02B 2006/12061
USPC .................. 257/184, 432, 459; 385/129–131
See application file for complete search history.

(56) References Cited

U.S. PATENT DOCUMENTS

| | | | |
|---|---|---|---|
| 7,397,101 B1 * | 7/2008 | Masini | H01L 31/028 257/184 |
| 7,693,354 B2 * | 4/2010 | Carothers | G02B 6/122 385/1 |

(Continued)

OTHER PUBLICATIONS

H. Chen, P. Verheyen, P. De Heyn, G. Lepage, J. De Coster, S. Balakrishnan, P. Absil, W. Yao, L. Shen, G. Roelkens, and J. Van Campenhout, "−1 V bias 67 GHz bandwidth Si-contacted germanium waveguide p-i-n photodetector for optical links at 56 Gbps and beyond," Opt. Express 24, 4622-4631 (2016).

(Continued)

*Primary Examiner* — Matthew E Warren
(74) *Attorney, Agent, or Firm* — Patterson + Sheridan, LLP

(57) ABSTRACT

Embodiments herein describe a photonic device that includes a germanium photodetector coupled to multiple silicon waveguides. In one embodiment, the silicon waveguides optically couple to a layer of germanium material. In one embodiment, if the germanium material forms a polygon, then a respective silicon waveguide optically couple to each of the corners of the polygon. Each of the plurality of input silicon waveguides may be arranged to transmit light in a direction under the germanium that is offset relative to both sides of the germanium forming the respective corner. In another example, the germanium material may be a circle or ellipse in which case the silicon waveguides terminate at or close to a non-straight, curved surface of the germanium material. As described below, optically coupling the silicon waveguides at a non-straight surface can reduce the distance charge carriers have to travel in the optical detector which can improve bandwidth.

20 Claims, 8 Drawing Sheets

(56) References Cited

U.S. PATENT DOCUMENTS

| 2016/0062063 | A1* | 3/2016 | Ogura | G02B 6/428 |
| | | | | 385/14 |
| 2016/0161691 | A1* | 6/2016 | Hayakawa | G02B 6/4295 |
| | | | | 250/227.21 |
| 2017/0104109 | A1* | 4/2017 | Simoyama | G02B 6/12004 |

OTHER PUBLICATIONS

Guoliang Li, Ying Luo, Xuezhe Zheng, Gianlorenzo Masini, Attila Mekis, Subal Sahni, Hiren Thacker, Jin Yao, Ivan Shubin, Kannan Raj, John E. Cunningham, and Ashok V. Krishnamoorthy, "Improving CMOS-compatible Germanium photodetectors," Opt. Express 20, 26345-26350 (2012).

C. Chang, J. H. Sinsky, P. Dong, G. de Valicourt, and Y. Chen, "Dual-illuminated Parallel-fed Traveling Wave Germanium Photodetectors," in Optical Fiber Communication Conference, OSA Technical Digest (online) (Optical Society of America, 2015), paper W3A.5. https://www.osapublishing.org/abstract.cfm?URI=OFC-2015-W3A.5.

Shia-Ming Chang, Jeffrey H. Sinsky, Po Dong, Guilhem de Valicourt, and Young-Kai Chen, "High-power dual-fed traveling wave photodetector circuits in silicon photonics," Opt. Express 23, 22857-22866 (2015).

Guanyu Chen, Yu Yu, Xi Xiao, and Xinliang Zhang, "High speed and high power polarization insensitive germanium photodetector with lumped structure," Opt. Express 24, 10030-10039 (2016).

L. Chrostowski and M. Hochberg, "Silicon Photonics Design" Cambridge University Press (2015).

* cited by examiner

GERMANIUM MULTI-DIRECTIONAL DETECTOR

TECHNICAL FIELD

Embodiments presented in this disclosure generally relate to germanium detectors, and more specifically, to aligning silicon waveguides to corners or curved surfaces of a germanium detector.

BACKGROUND

Silicon-on-Insulator (SOI) optical devices may include an active surface layer that includes waveguides, optical modulators, detectors, CMOS circuitry, metal leads for interfacing with external semiconductor chips, and the like. The active surface can also include photodetectors that convert the light propagating in the waveguides into electrical signals. Although crystalline silicon is excellent at forming waveguides with submicron dimensions, silicon is a poor material for both generating and absorbing light at wavelengths used for digital communication. While III-V semiconductors are better suitable for photodetectors, these material are expensive and their fabrication techniques are less advances than those used for silicon.

BRIEF DESCRIPTION OF THE DRAWINGS

So that the manner in which the above-recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DESCRIPTION OF EXAMPLE EMBODIMENTS

Overview

Figure 1:
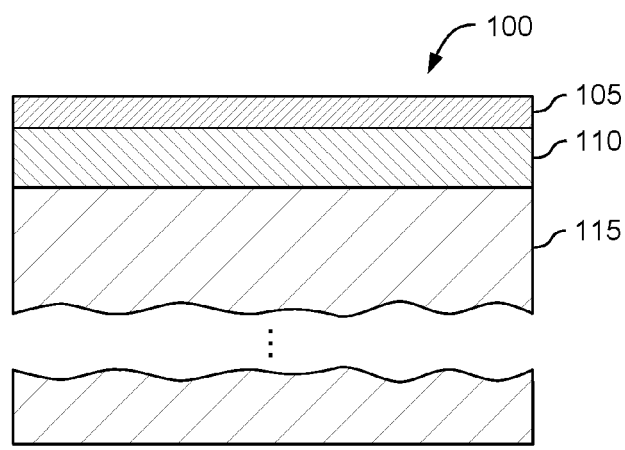
FIG. 1 illustrates a SOI device, according to one embodiment disclosed herein.

One embodiment presented in this disclosure is an optical detector that includes a crystalline silicon layer including a plurality of input silicon waveguides and germanium contacting the crystalline silicon layer and forming a polygon where each of the plurality of input silicon waveguides extends below a respective corner of the germanium and where each of the plurality of input silicon waveguides is arranged to transmit light in a direction under the germanium that is offset relative to both sides of the germanium forming the respective corner. The optical detector includes a plurality of electrical contacts contacting the crystalline silicon layer where each one of the plurality of input silicon waveguides is disposed between a respective pair of the plurality of electrical contacts.

Another embodiment described herein is an optical system that includes a silicon-on-insulator (SOI) structure including a crystalline silicon layer where the crystalline silicon layer comprises a plurality of input silicon waveguides and germanium contacting the crystalline silicon layer and forming a polygon where each of the plurality of input silicon waveguides extend below a respective corner of the germanium and where each of the plurality of input silicon waveguides is arranged to transmit light in a direction under the germanium that is offset relative to both sides of the germanium forming the respective corner. The optical system includes a plurality of electrical contacts contacting the crystalline silicon layer where each one of the plurality of input silicon waveguides is disposed between a respective pair of the plurality of electrical contacts.

Another embodiment described herein is an optical detector that includes a crystalline silicon layer comprising a plurality of input silicon waveguides and germanium contacting the crystalline silicon layer where the germanium forms a circular shape and where each of the plurality of input silicon waveguides extends below the germanium. The optical detector includes a plurality of electrical contacts contacting the crystalline silicon layer where each one of the plurality of input silicon waveguides is disposed between a respective pair of the plurality of electrical contacts.

Example Embodiments

The embodiments of the present disclosure describe a photonic device that includes a germanium photodetector coupled to silicon waveguides. Unlike silicon, germanium is an efficient detector at the wavelength of optical signals typically used for data communication. Moreover, because germanium is a group IV element along with silicon, germanium can be deposited or grown on crystalline silicon. In the embodiments herein, germanium is coupled to at least one silicon waveguide in the active layer of a SOI device to form an optical detector.

In one embodiment, multiple silicon waveguides form inputs to the germanium optical detector. For example, the silicon waveguides may terminate beneath or slightly before a layer of germanium material. Moreover, the silicon and germanium may be doped to form avalanche photodiode (APD), a PIN or PN junction where the silicon waveguides terminate, and other structures. In one embodiment, both the silicon and germanium material is doped using N and P dopants to form a vertical PIN junction. Alternatively, only the silicon material is doped with the N and P dopants to form a PIN photodetector.

In one embodiment, the silicon waveguides extend below a non-straight surface of the germanium material. For example, if the germanium material forms a geometric shape with a plurality of corners, then a respective silicon waveguide terminates at or immediately before (e.g., 1 nanometer to a few microns) each of the corners of the, for example, polygon. In one embodiment, the silicon waveguides extend below a corner of the polygon rather than at a straight surface such that the waveguides are offset relative to the sides form the corner of the germanium. In another example, the germanium material may be a circle or ellipse in which case the silicon waveguides terminate at or close to a curved surface of the germanium material. As described below, terminating the silicon waveguides at a non-straight surface can reduce the distance charge carriers (e.g., electrons or holes) have to travel in the optical detector which can improve its bandwidth.

FIG. 1 illustrates a (silicon-on-insulator) SOI device 100, according to one embodiment disclosed herein. SOI device 100 includes a surface layer 105, a buried insulation layer 110 (also referred to as buried oxide (BOX) layer), and a semiconductor substrate 115. Although the embodiments herein refer to the surface layer 105 and substrate 115 as silicon, the disclosure is not limited to such. For example, other semiconductors or optically transmissive materials may be used to form the structure 100 shown here. Moreover, the surface 105 and the substrate 115 may be made of the same material, but in other embodiments, these layers 105, 115 may be made from different materials.

The thickness of the surface layer 105 may range from less than 100 nanometers to greater than a micron. More specifically, the surface layer 105 may be between 1 nanometer to a few microns thick. The thickness of the insulation layer 110 may vary depending on the desired application. In one embodiment, the thickness of insulation layer 110 may range from less than one micron to tens of microns. The thickness of the substrate 115 may vary widely depending on the specific application of the SOI device 100. For example, the substrate 115 may be the thickness of a typical semiconductor wafer (e.g., 100-700 microns) or may be thinned and mounted on another substrate.

For optical applications, the silicon surface layer 105 and insulation layer 110 (e.g., silicon dioxide, silicon oxynitride, and the like) may provide contrasting refractive indexes that confine an optical signal in a silicon waveguide in the surface layer 105. In a later processing step, the surface layer 105 of the SOI device 100 may be etched to form one or more silicon waveguides. Because silicon has a higher refractive index compared to an insulator such as silicon dioxide, the optical signal remains primarily in the waveguide as it propagates across the surface layer 105.

Figure 2:
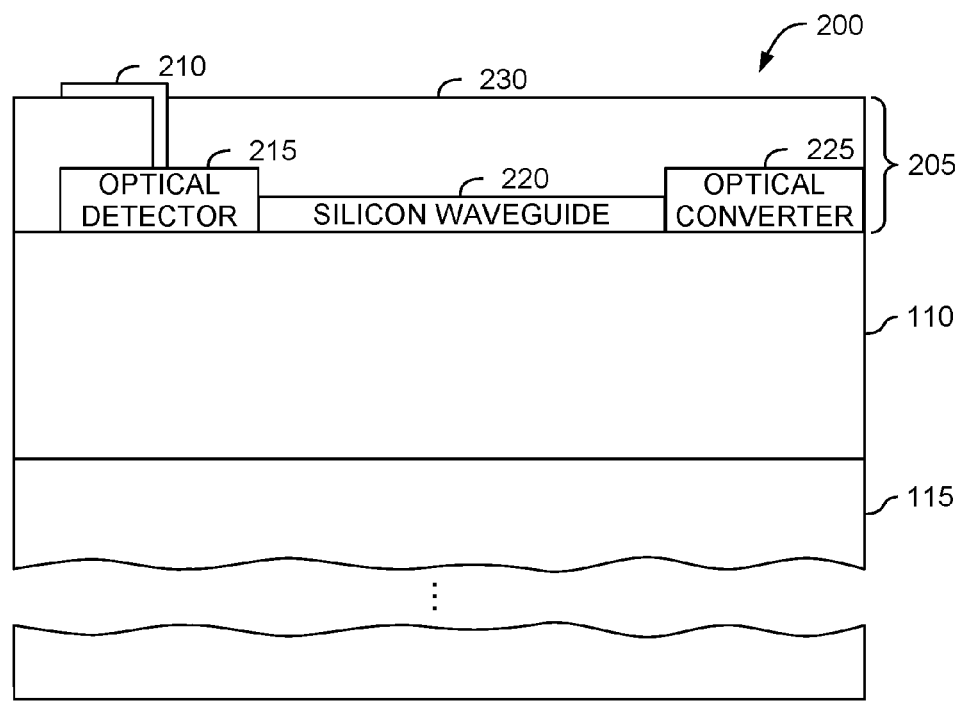
FIG. 2 illustrates a SOI device with an optical detector coupled to a silicon waveguide, according to one embodiment disclosed herein.

FIG. 2 illustrates a SOI device 200 with an optical detector 215 coupled to a silicon waveguide 220, according to one embodiment disclosed herein. Like the SOI device 100 in FIG. 1, SOI device 200 includes a top surface layer 205, insulation layer 110, and substrate 115. However, the surface layer 205 has been processed to include various optical components that may be used in an optical device. For example, surface layer 205 includes an optical detector 215 with a metal lead 210. The detector 215 may be formed by performing various fabrication steps on the silicon layer such as etching or doping the silicon material as well as depositing or growing additional materials onto surface layer 205 such as germanium. Metal lead 210 represents any number of traces or contacts that can be used to transmit electrical signals generated by the optical detector 215. For example, the optical detector 215 may have n-type and p-type doped regions coupled to respective metal leads 210 for generating or transmitting electrical signals that correspond to the absorbed optical signal passing through the silicon waveguide 220. Although not shown, the metal lead 210 may be connected to an integrated circuit mounted onto the SOI device 200 that receives and processes the electrical signals generated by the optical detector 215. In another embodiment, the integrated circuit may be physically separate from the SOI device 200 but couple to the metal lead 210 via a bond wire.

The silicon waveguide 220 may have been fabricated from a silicon surface layer (e.g., layer 105 of FIG. 1). SOI device 200 may use waveguide 220 to carry an optical signal to different areas of the surface layer 205. In this example, the silicon waveguide 220 transmits optical signals received from an optical converter 225 to the optical detector 215, but in other examples, the silicon waveguide 220 may receive the optical signals from other components in the SOI device 200.

In addition to including components made from silicon, surface layer 205 may include other components which may be made from other materials (e.g., a germanium detector 215) or a combination of silicon with other materials. The other materials may be deposited or grown on surface layer 205 using any suitable fabrication techniques. Once the surface layer 205 is processed to include the desired components, the components may be covered with a protective material 230 (e.g., an electrical insulative material) which may serve as a suitable base for mounting additional circuitry on the SOI device 200. In this manner, the silicon surface layer 205 of SOI device 200 may be processed using any number of techniques to form a device for performing a particular application such as optical modulation, detection, amplification, generating an optical signal, and the like.

Surface layer 205 also includes the optical converter 225 coupled to the silicon waveguide 220. As shown, one interface of the optical converter 225 is coupled to the waveguide 220 while another interface is proximate to an outer or external surface of the SOI device 200. Although the optical converter 225 is shown as being exposed on the outer surface of the device 200, in other embodiments the converter 225 may be recessed slightly from the outer surface. In one embodiment, the converter 225 may be made of the same material as the waveguide 220. For example, the converter 225 and waveguide 220 may both be made of silicon. In one embodiment, the converter 225 may include a plurality of stacked layers that are processed (e.g., etched) such that an optical signal striking the exposed surface of the converter is focused into the waveguide 220. The converter may couple light from the side or top or bottom surfaces of 200 into the waveguide.

The optical converter 225 may be designed to efficiently couple to an external light-carrying medium. Because the dimensions of the silicon waveguide 220 may result in high optical losses if directly connected to an external light-carrying medium, the light-carrying medium may instead be coupled to the converter 225 which then transfers the signal into the silicon waveguide 220. Doing so may eliminate the need for using lenses between the external light-carrying medium and the waveguide 220 which focus the optical signal into a mode with a diameter similar to the dimensions of the waveguide 220. Stated differently, in one embodiment, the converter 225 may permit the external light-carrying medium to transmit light directly into SOI device 200 without the addition of external focusing elements such as lenses.

Figure 3:
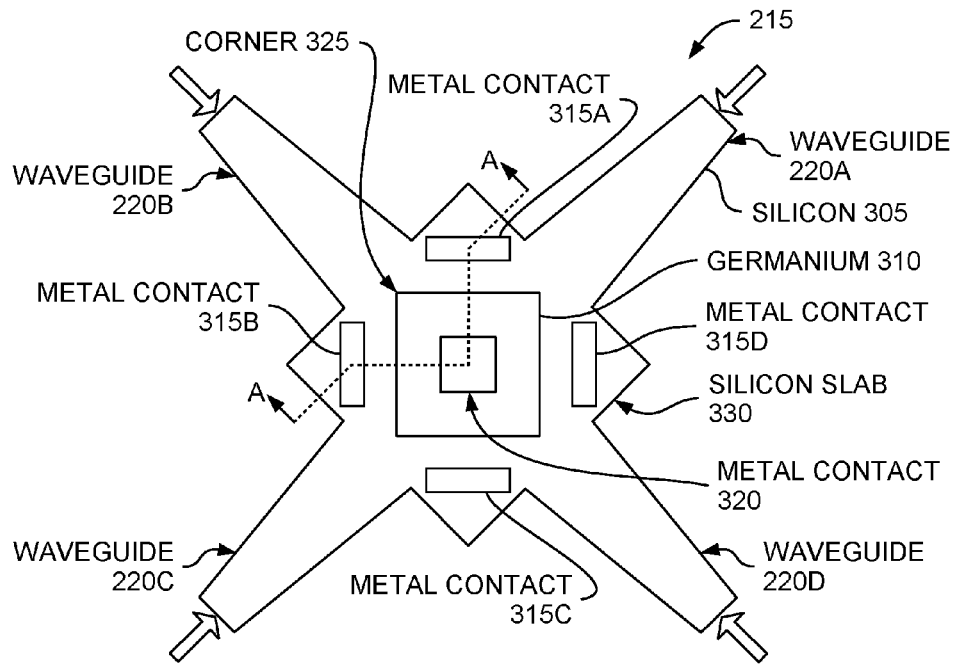
FIG. 3 illustrates a vertical optical detector structure, according to one embodiment disclosed herein.

FIG. 3 illustrates a vertical structure of the optical detector 215, according to one embodiment disclosed herein. Specifically, FIG. 3 illustrates a top view of the optical detector 215 which may be fabricated in the device layer of a SOI (not shown). The optical detector 215 includes germanium 310 disposed on a top surface of crystalline silicon 305 that forms a geometric shape with a plurality of corners. As shown, the germanium 310 forms a polygon but in other examples, the germanium 310 may include curved sides as well as straight sides so long as at least two sides meet to form a corner.

The germanium 310 is disposed on a silicon slab 330. In addition, the optical detector 215 includes four metal contacts 315 that are also contacting the top surface of the silicon slab 330. In this embodiment, the metal contacts 315 are disposed on both sides of four silicon waveguides 220 that extend toward the germanium 310 and terminate at the silicon slab 330. The four waveguides 220 extend in a direction as illustrated by the arrows when approaching the germanium 310. As such, the waveguides 220 transmit light underneath the germanium 310 in the direction illustrated by the arrows. The light carried by the four waveguides 220 is index coupled through by the silicon slab 330 up into the germanium 310 where the light is absorbed at respective corners of the germanium 310 which results in charge carriers (e.g., hole and electron pairs) in the germanium 310. That is, the waveguides 220 are optically coupled to respective corners of the germanium 310 via the silicon slab 330. Because the corners of the germanium 310 are formed by two sides of the germanium 310, the waveguides 220 extend towards a non-straight surface of the germanium 310 (e.g., there is a ninety degree bend to form the corner).

In addition to the metal contacts 315 on the silicon 305, a metal contact 320 is disposed on a top surface of the germanium 310. In one embodiment, the metal contacts 315 serve as anodes, while the metal contact 320 on the germanium 310 serves as a cathode in a PIN junction (or vice versa) which will be described in more detail below. Generally, the metal contacts 315 and 320 generate an electric field that collects the electron and hole pairs generated when the light transmitted by the silicon waveguides 220 is absorbed by the germanium 310.

In FIG. 3, the waveguides 220 and the germanium 310 are arranged such that the waveguides 220 extend towards a corner of the germanium 310. That is, instead of extending in a direction perpendicular to one of the sides of the germanium 310, the waveguides 220 are offset from the sides of the germanium 320. Thus, the waveguides 220 are not perpendicular or parallel to any side of the germanium 310 but rather transmit light in a direction that is offset from the direction perpendicular or parallel to the surfaces of the germanium 310. In this embodiment, the waveguides 220 extend in a direction that is offset approximately 45 degrees relative to the two sides of the germanium 310 forming the corners. In one embodiment, the waveguides 220 are centered with a respective corner 325 of the germanium 310. For example, the corner 325 may be disposed in the middle of the portion of the waveguide 220B which couples to the corner 325 of the germanium 310. The waveguides 220 terminate at respective locations on the silicon slab 330 which may be spaced 1 nanometer to a few microns away from the germanium 310.

One non-limiting advantage of arranging the waveguides 220 such that the waveguides are aligned with a corner of the germanium 310 is doing so reduces the distance the resulting charge carrier travels in order to reach one of metal contacts 315 relative to a detector where the waveguides 220 are arranged in a direction perpendicular to a side of the germanium 310. For example, if the optical detector 215 only had two waveguides that extend in a direction perpendicular to the left and right surfaces of the germanium 310 and only had the two metal contacts 315A and 315C (but not the metal contacts 315B and 315D), the charge carriers would need to travel from the left and right surfaces of the germanium to the metal contacts 315A and 315C. However, with the structure shown in FIG. 3, the charge carriers travel from the corner 325 of the germanium 310 to the metal contacts 315A and 315B which is a shorter distance.

The intensity distribution between several optical waveguide achieved by the geometry of the optical detector 215 shown in FIG. 3 can result in improved bandwidth linearity. That is, the angular coupling of the waveguides 220 to the corners or vertices of the germanium 310 improve the bandwidth linearity. Typically, the light is absorbed within the first few hundreds of nanometers in the germanium 310. This results in a high density of charge carriers in a relatively small area of the germanium 310. As the intensity of light increases, the density of the charge carriers also increases which can decrease the bandwidth of the optical detector due to increased space charges. However, the embodiments herein decrease the amount of the charge carriers at each corner of the detector which means that each corner of the optical detectors experience lower space charge which improves the linearity of the bandwidth. That is, an increase in intensity results in a smaller reduction in bandwidth relative to an optical detector with fewer input waveguides and thus less uniform illumination of the germanium 310 is used.

Further, a bandwidth increase results from placing the metal contacts 315 on both sides of the waveguides 220. The angular placement of the waveguides 220 between the metal contacts 315 decreases the transit distance of the charge carriers, thus, increasing the bandwidth transit limit while improving the electronic RC limited bandwidth. Moreover, the waveguides 220 are tapered to achieve low-reflectance when coupling to the germanium 310. That is, as the waveguides 220 extend towards the germanium 310 and the silicon slab 330, the width of the waveguides 220 increases.

In one embodiment, the germanium 310 has a width and length that is less than 10 microns. In one embodiment, the germanium 310 has a width and length that is between 3-6 microns. Moreover, the thickness of the germanium 310 (e.g., the direction into and out of the page) may range from 0.05 to 1 microns.

Figure 4:
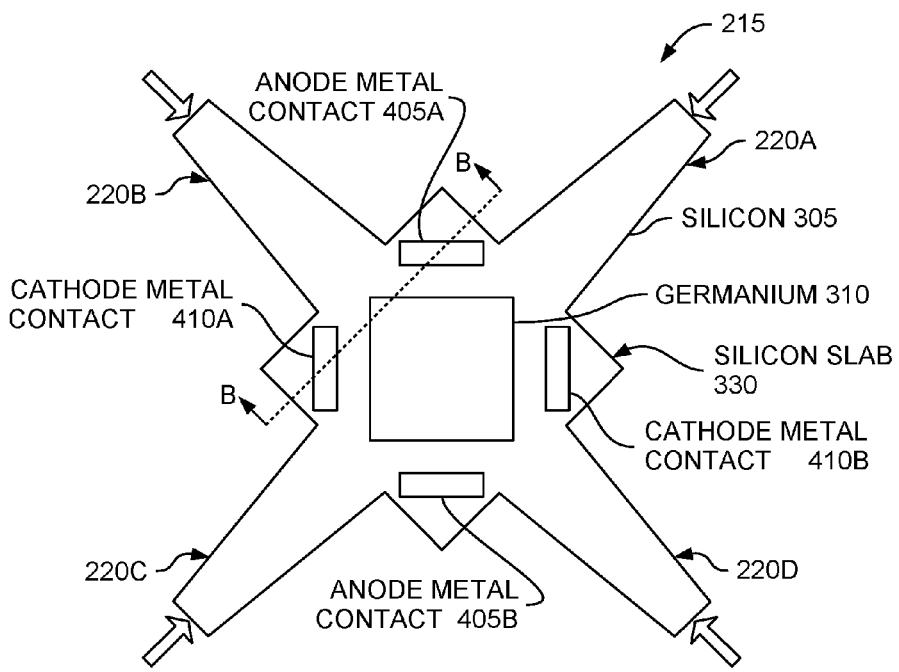
FIG. 4 illustrates a lateral optical detector structure, according to one embodiment disclosed herein.

FIG. 4 illustrates a lateral structure of optical detector 215, according to one embodiment disclosed herein. The optical detector 215 in FIG. 4 is the same as the detector 215 in FIG. 3 except that the metal contact 320 has been removed. In FIG. 4, anode metal contacts 405A and 405B and cathode metal contacts 410A and 410B are disposed in the same locations as metal contacts 315A-D in FIG. 3. As described in below, the anode metal contacts 405 and cathode method contacts 410 generate lateral PIN junctions while the metal contacts 315 and 320 in FIG. 3 generate vertical PIN junctions.

Figure 5:
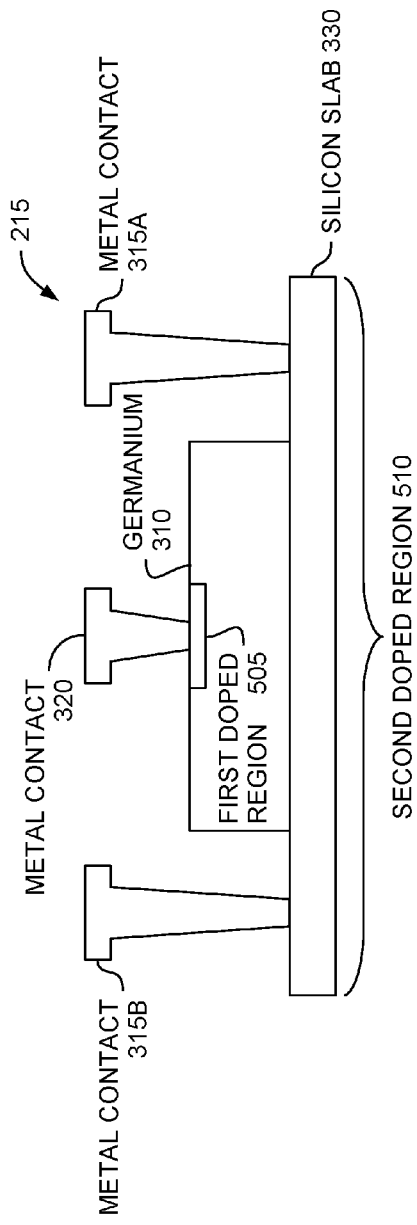
FIG. 5 illustrates a cross sectional view of the vertical optical detector in FIG. 3, according to one embodiment disclosed herein.

FIG. 5 illustrates a cross sectional view of the vertical optical detector 215 in FIG. 3, according to one embodiment disclosed herein. Specifically, FIG. 5 is a cross section at the dotted line labeled A-A in FIG. 3. As shown, the metal contact 320 contacts a top surface of the germanium 310 at a first doped region 505. The metal contacts 315A and 315B contact a top surface of the silicon 305 at a second doped region 510 which has an opposite doping than the first doped region 505. Thus, voltages can be driven on the metal contacts 315 and 320 to create a vertical PIN junction using the first and second doped regions 505 and 510.

As mentioned above, the waveguides are coupled to the silicon slab 330 which directs the light received from the waveguides up into the germanium 310, thereby optically coupling the waveguides to a respective corner of the germanium 310. As such, the light propagating in the waveguides is absorbed by the germanium 310 which generates charge carriers in the germanium 310. The electrical field of the PIN junction moves the charge carriers to one of the metal contacts. For example, if the metal contacts 315A and 315B are driven with a more negative voltage, the holes move towards these contacts. Since the metal contact 320 has a more positive voltage, this contact 320 collects the electrons. The current caused by these charge carriers can be detected by an electrical sensor and correlated to the intensity of the light propagating in the waveguide 220B.

In one embodiment, for the O-band, the transit distance from the germanium 310 to the metal contacts 315A and 315B for the charge carriers is less than 0.2 microns. In the C-band, the transit distance may be higher due to Ge band-gap. The precise wavelength dependence is defined by a growth process. The majority of the charge carriers may be generated in the corner of the germanium 310 centered with the waveguide. Using the structure shown here and in FIG. 3, the charge carriers (e.g., either the holes or the electrons depending on whether the contacts 315A and 315B are anodes or cathodes) have to travel at most 0.2 microns to reach one of the metal contacts 315A and 315B. Because the bandwidth of the optical detector 215 is limited by the longest transit distance for the charge carriers (whether to the metal contacts 315A and 315B or to the metal contact 320), the thickness of the germanium 310 can also be controlled to reduce the distance the charge carriers travel to reach the metal contact 320 disposed on the top of the germanium 310. For example, the transit distance may be the same or substantially the same (e.g., within +/−0.1 microns) between the corner of the germanium 310 to the metal contacts 315A and 315B and between the corner and the metal contact 320. In one embodiment, the structure shown in FIGS. 3 and 5 can achieve a transit time bandwidth limit of 106 GHz.

Figure 6:
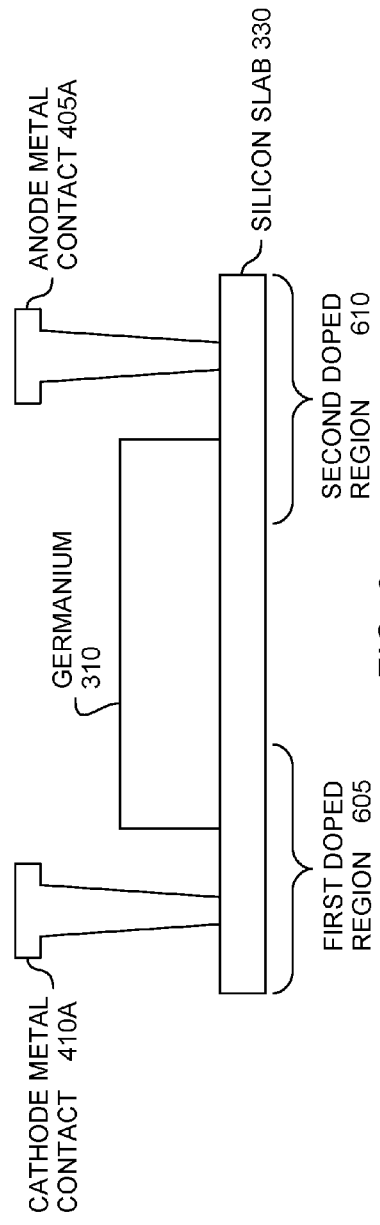
FIG. 6 illustrates a cross sectional view of the lateral optical detector structure in FIG. 4, according to one embodiment disclosed herein.

FIG. 6 illustrates a cross sectional view of the lateral optical detector structure in FIG. 4, according to one embodiment disclosed herein. Specifically, FIG. 6 is a cross section at the dotted line labeled B-B in FIG. 4. For example, the waveguide 220B (not shown) may terminate at the silicon slab 330 at a location between a first doped region 605 and a second doped region 610. The cathode metal contact 410A contacts the first doped region 605 while the anode metal contact 410B contacts the second doped region 610. As above, the first doped region 605 is doped oppositely to the second doped region 610 to form a PIN junction (e.g., a lateral PIN junction extending along the silicon 305). Voltages can then be driven on the metal contacts 405A and 410A to generate an electrical field in the PIN junction in the silicon slab 330.

As mentioned above, the light propagating from the waveguide is index-coupled up from the silicon slab 330 into the germanium 310 such that the light is absorbed by the germanium 310. Doing so generates charge carriers in the germanium 310 and in the electrical field of the PIN junction. The electrical field moves the charge carriers to one of the metal contacts 405A and 410A. The current caused by these charge carriers can be detected by an electrical sensor and correlated to the intensity of the light propagating in the waveguide.

In one embodiment, the transit distance from the germanium 310 at the interface with the silicon 305 to the metal contacts 405A and 410A for the charge carriers is less than 0.2 microns. For example, the majority of the charge carriers may be generated in the corner of the germanium 310 centered over the waveguide 220B. Using the structure shown here and in FIG. 4, the charge carriers have to travel at most 0.2 microns to reach on of the metal contacts 405A and 410A. In one embodiment, the structure shown in FIGS. 4 and 6 can achieve a transit time bandwidth limit of 179 GHz.

Figure 7:
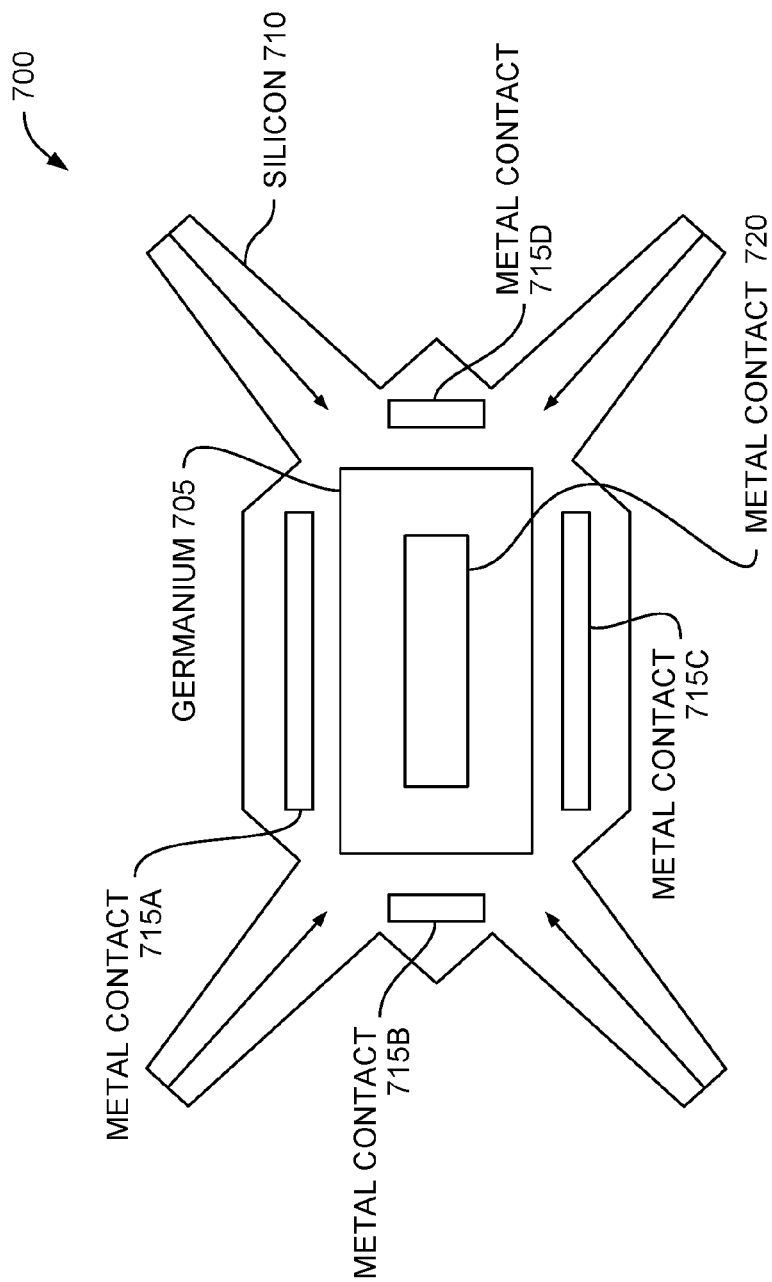
FIG. 7 illustrates an optical detector structure, according to one embodiment disclosed herein.

FIG. 7 illustrates an optical detector 700, according to one embodiment disclosed herein. Like in FIGS. 3 and 4, the optical detector 700 includes four waveguides in silicon 710 that are angled to extend towards a respective corner of germanium 705. In this embodiment, instead of a square, the germanium 705 has a rectangular shape where a width is larger than its length. To compensate for the increased width, metal contacts 715A and 715C are extended relative to the metal contacts 315A and 315C in FIG. 3. Thus, even though the width of the germanium 310 is increased, the increased length of the metal contacts 715A and 715C means that most of the charge carries generated at the corners of the germanium 310 have a similar transit distance as the optical detector 215 in FIG. 3.

Although FIG. 7 illustrates a vertical optical detector, the optical detector can be modified to be a lateral optical detector. For example, the silicon 305 can be doped as shown in FIG. 4 and the metal contacts 715A and 715C can be anode contacts while the metal contacts 715B and 715D are cathode contacts. Thus, regardless of the arrangement of the PIN junction, the germanium and silicon can be different shapes such as the square or rectangular shapes discussed above.

Figure 8:
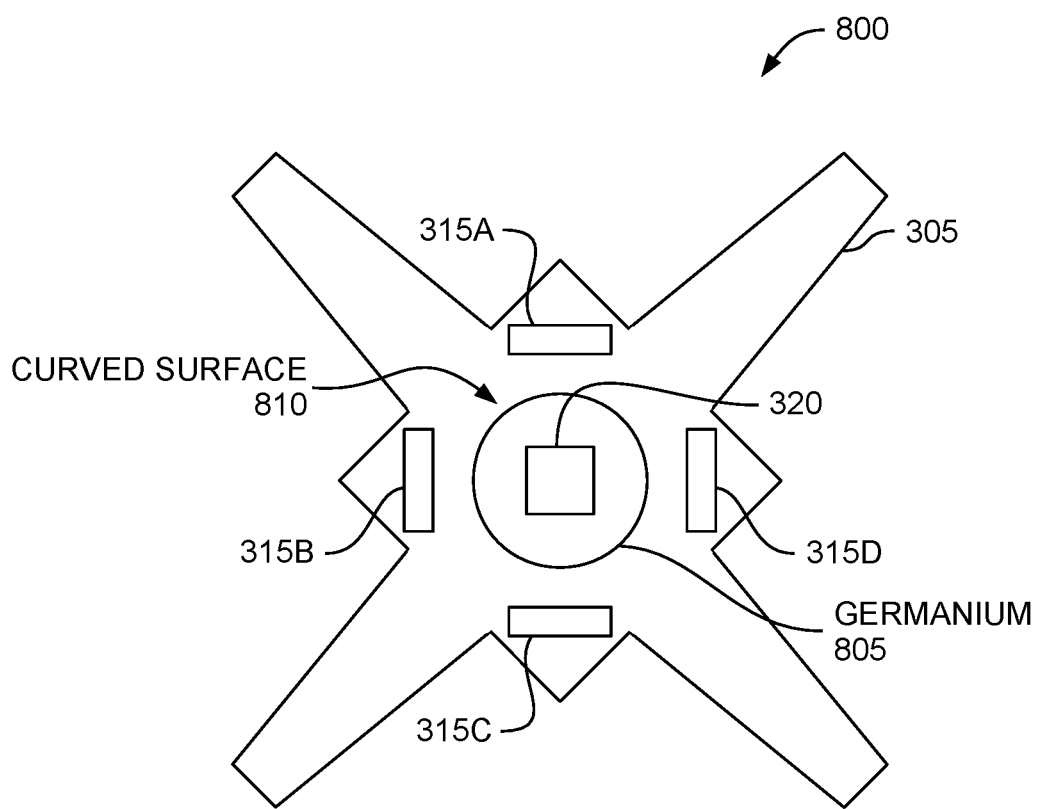
FIG. 8 illustrates an optical detector structure, according to one embodiment disclosed herein.

FIG. 8 illustrates an optical detector 800, according to one embodiment disclosed herein. Instead of a square or rectangle, the germanium 805 is a circular shape such as a circle or ellipse. In this embodiment, the four waveguides extend to a curved surface 810 of the germanium 805. Thus, the waveguides extend below a non-straight surface of the germanium 805. Like above, the four waveguides are optically coupled to the curved surface 810 such that light transmitted in the four waveguides is transmitted through the silicon slab up into the germanium 805. Moreover, the optical detector 800 includes the metal contact 320 in the middle of the circle to form a vertical PIN junction. However, in another embodiment, the optical detector 800 can be arranged similar to the optical detector 215 in FIG. 4 to form a lateral PIN junction. In that arrangement, the metal contact 320 would be omitted and the metal contacts 315 would be used to form anode and cathode pairs as described above.

In either embodiment, the waveguides are centered between a respective pair of the metal contacts 315. In one embodiment, the center of the waveguides may be centered between the metal contacts 315 so that the waveguide is equidistant from the two metal contacts 315 so that the charge carriers can be efficiently collected regardless where they are created in the germanium 805.

Figure 9:
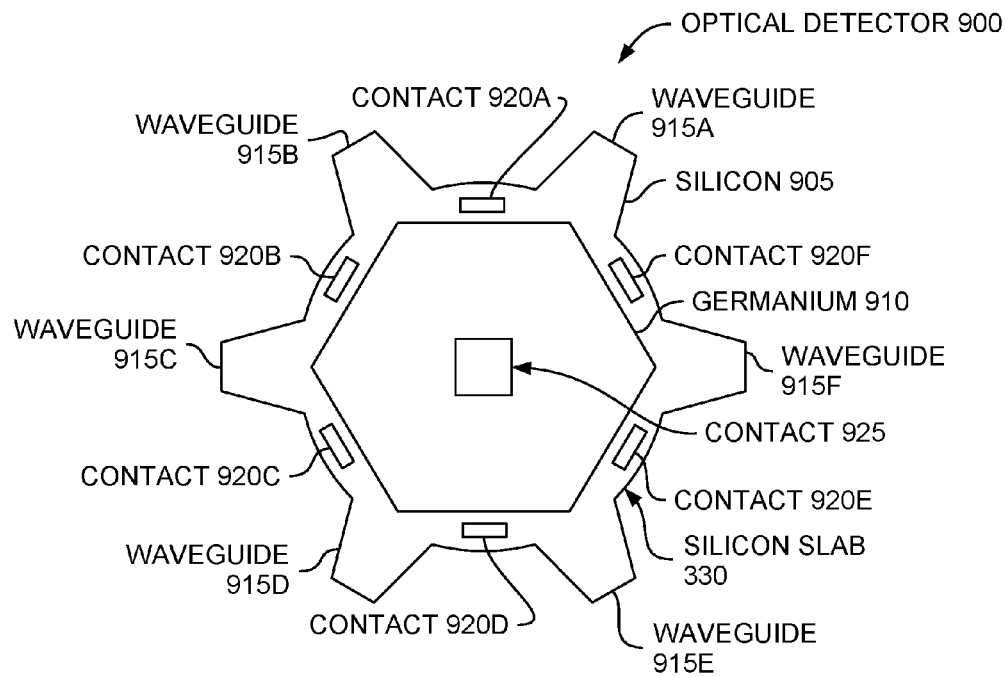
FIG. 9 illustrates a vertical optical detector structure, according to one embodiment disclosed herein.

FIG. 9 illustrates a vertical optical detector structure, according to one embodiment disclosed herein. FIG. 9 illustrates an optical detector 900 that includes more input waveguides 915 than the waveguides 220 in the optical detectors 215 shown in FIGS. 3 and 4. In this example, the optical detector 900 includes six input waveguides 915 instead of four, which each is optically coupled to a respective corner in the germanium 910. That is, the waveguides 915 in the silicon 905 terminate at a location in a silicon slab 930 near a corner of the germanium 910 (e.g., 1 nanometer to a few microns). The silicon slab 930 couples the light from the silicon waveguide 915 up into the germanium 805. Moreover, the light is propagated in a direction that is offset relative to both of the sides of the germanium 910 forming the corner. Put differently, the direction the light propagates in the waveguides 220 is neither perpendicular nor parallel to either of the sides forming the corner of the germanium 910 to which the waveguide 220 extends. In one embodiment, the waveguides 915 are centered with the corners of the germanium 910. Moreover, the waveguides 915 are tapered such the width increases as the waveguides 915 extend towards the germanium 910 and the silicon slab 930. Thus, like the embodiments above, the waveguides 915 optically couple to a non-straight surface of the germanium 910—i.e., a corner of the germanium 910 comprising a surface with a bend.

In FIG. 9, the germanium 910 is shaped like a hexagon to provide six corners aligned with the six input waveguides 915. To form the vertical detector structure, a metal contact 925 is disposed on top of the germanium 910 while metal contacts 920A-F are disposed on the top of the silicon 905. Moreover, the waveguides 915 are disposed between respective pairs of the metal contacts 920. In one embodiment, the center of the waveguides 915 is centered between the pair of metal contacts 920.

Figure 10:
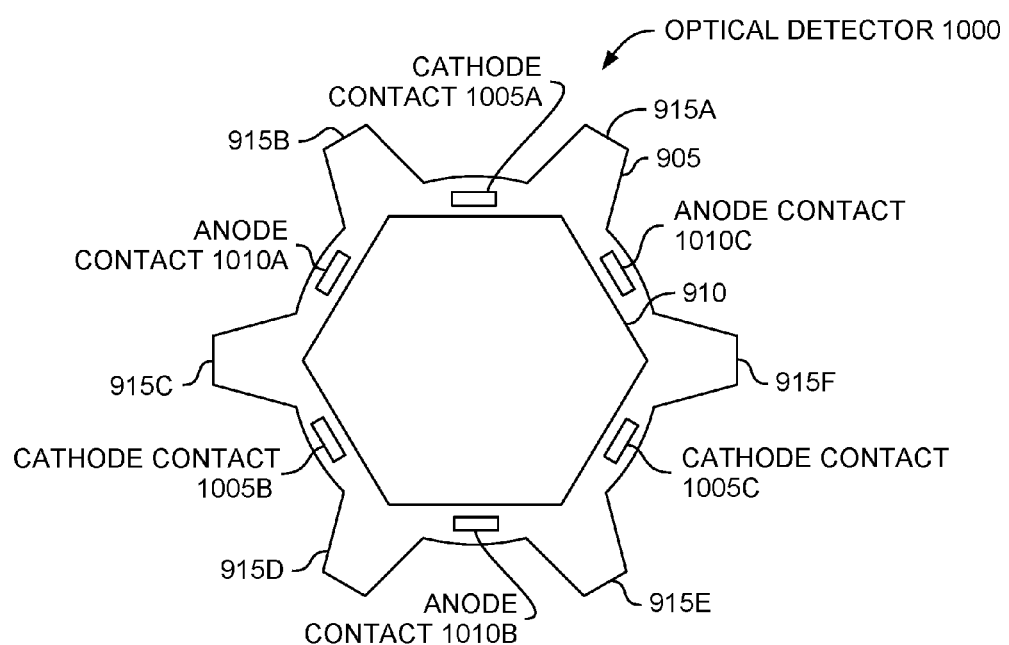
FIG. 10 illustrates a lateral optical detector structure, according to one embodiment disclosed herein.

FIG. 10 illustrates a lateral optical detector structure, according to one embodiment disclosed herein. FIG. 10 illustrates an optical detector 1000 similar to the optical detector 900 in FIG. 9. However, instead of vertical PIN junction, the optical detector 1000 includes cathode contacts 1005 and anode contacts 1010 that form lateral PIN junctions where the waveguides 915 intersect with the germanium 910. Moreover, the optical detector 1000 does not include a metal contact on the top layer of the germanium 910. However, the remaining structure and arrangement may be the same as described above in FIG. 9.

Figure 11:
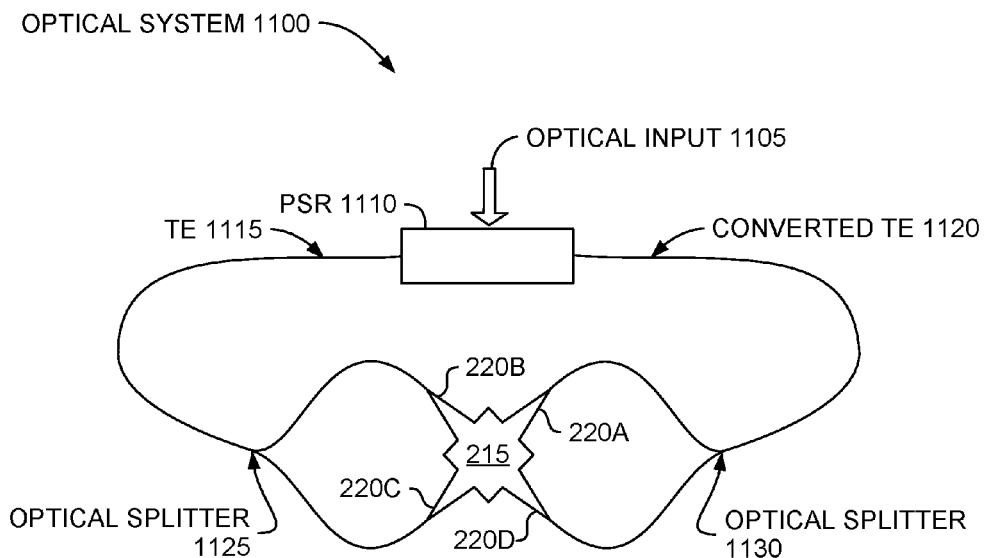
FIG. 11 illustrates an optical system that includes an optical detector, according to one embodiment disclosed herein.

FIG. 11 illustrates an optical system 1100 that includes an optical detector 215, according to one embodiment disclosed herein. In one embodiment, the optical system 1100 is embodied in a photonic chip (e.g., a SOI structure). For example, the structures shown in optical system 1100 may be formed in silicon (e.g., crystalline silicon waveguides) or disposed on (or integrated with) the silicon such as the germanium in the optical detector 215.

In this example, the optical system 1100 converts an optical input 1105 into four optical signals that are then inputted into the waveguides 220 of the optical detector 215. That is, the optical system 1100 can receive the optical input 1105 from an internal or external light source (e.g., a laser or optical fiber) which is then split into the four waveguides 220. Thus, the optical detector 215 can simultaneously receive signals from the four waveguides 220 which can be converted into electrical signals in parallel as described above.

To split the optical input 1105 into the four optical signals for the waveguides 220, the optical system 1100 includes a polarization splitter/rotator (PSR) 1110, an optical splitter 1125, and an optical splitter 1130. In one embodiment, the optical input 1105 may include optical signals that are transverse electric (TE) and transverse magnetic (TM) polarized referred to herein as a TE/TM optical signal. Silicon waveguides implemented in SOI are less efficient at transmitting TM polarized light than TE polarized light. Thus, if the optical system 1100 implements silicon waveguides, any TM polarized light in the optical input 1105 may be more attenuated than TE polarized light as the optical signal is transmitted to the optical detector 215. To mitigate this loss, the PSR 1110 rotates the TM polarized light down to converted TE polarized light. As shown, the TE polarized light 1115 is transmitted out of one optical port of the PSR 1110 while the converted TE polarized light 1120 is transmitted out of the other optical port. In one embodiment, if the optical input 1105 contains the same amount of TE light as TM light, the optical power outputted by the left and right optical ports of the PSR 1110 is the same. However, if the optical input 1105 does not include equal amounts of TM and TE polarized light, then one optical port outputs more optical power than the other. Different embodiments of an optical splitter and rotator such as PSR 1110 are disclosed in U.S. Pat. No. 8,873,899 which is incorporated by reference in its entirety.

The TE light 1115 is received at the beam splitter 1125 while the converted TE light 1120 is received at the beam splitter 1130. The beam splitters 1125 and 1130 divide the received optical signal into half such that half of the optical power is transmitted on one output while the other half is transmitted on the other output. The beam splitters 1125 and 1130 may be implemented using any kind of optical splitter—e.g., a Y splitter. The outputs of the optical splitters 1125 and 1130 are coupled to respective ones of the waveguides 220 which feed the optical signals into the optical detector 215. Using the PSR 1105 to rotate the TM polarized light into converted TE light may improve power absorption and consequently minimize receiver losses containing the optical system 1100.

Figure 12:
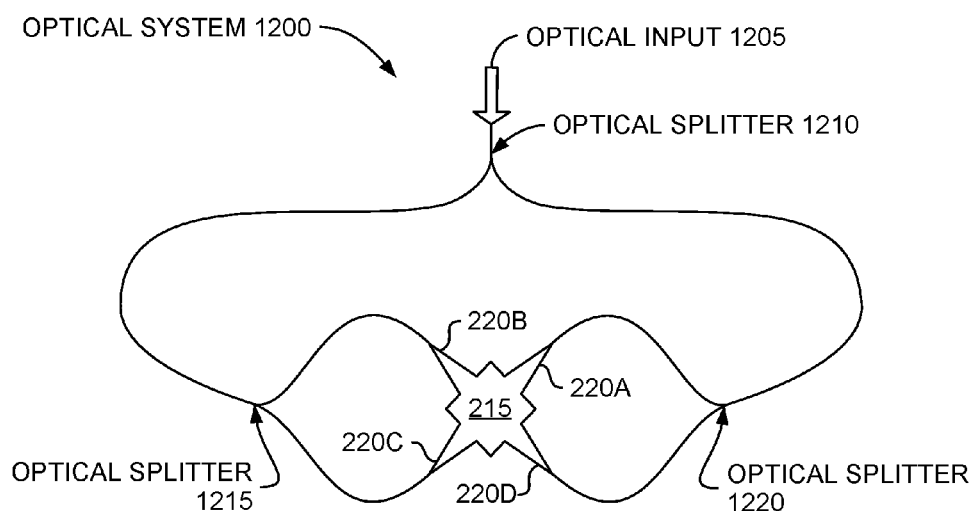
FIG. 12 illustrates an optical system that includes an optical detector, according to one embodiment disclosed herein.

FIG. 12 illustrates an optical system 1200 that includes the optical detector 215, according to one embodiment disclosed herein. In one embodiment, the optical system 1200 is embodied in a photonic chip (e.g., a SOI structure). For example, the structures shown in optical system 1200 may be formed in silicon (e.g., crystalline silicon waveguides) or disposed on (or integrated with) the silicon such as the germanium in the optical detector 215.

Like the optical system 1100 in FIG. 11, the optical system 1200 converts an optical input 1205 into four optical signals that are then inputted into the waveguides 220 of the optical detector 215. That is, the optical system 1200 can receive the optical input 1205 from an internal or external light source (e.g., a laser or optical fiber) which is then split into the four waveguides 220. Thus, the optical detector 215 can simultaneously receive signals from the four waveguides 220 which can be converted into electrical signals in parallel as described above.

However, instead of using a PSR, the optical system 1200 contains an optical splitter 1210 which splits the optical input 1205 into two optical signals with equal amounts of power. These signals are then split by optical splitters 1215 and 1220 to form four optical signals with equal power. However, in other embodiments, the optical splitters 1210, 1215, and 1220 may not split the received optical signal into signals with equal power but may use some other ratio—e.g., 60/40 power split.

The optical system 1200 may not account for different transmission efficiencies between TE and TM polarized light. For example, the optical system 1200 may be implemented using materials or structures where the attenuation of TE and TM polarized light is essentially the same (unlike in SOI). Or the optical system 1200 may be used in a scenario where the optical input 1205 is only TE or TM light. For example, if made using silicon waveguides, the optical system 1200 may be preferred if only TE polarized light is received at the optical input 1205.

Figure 13:
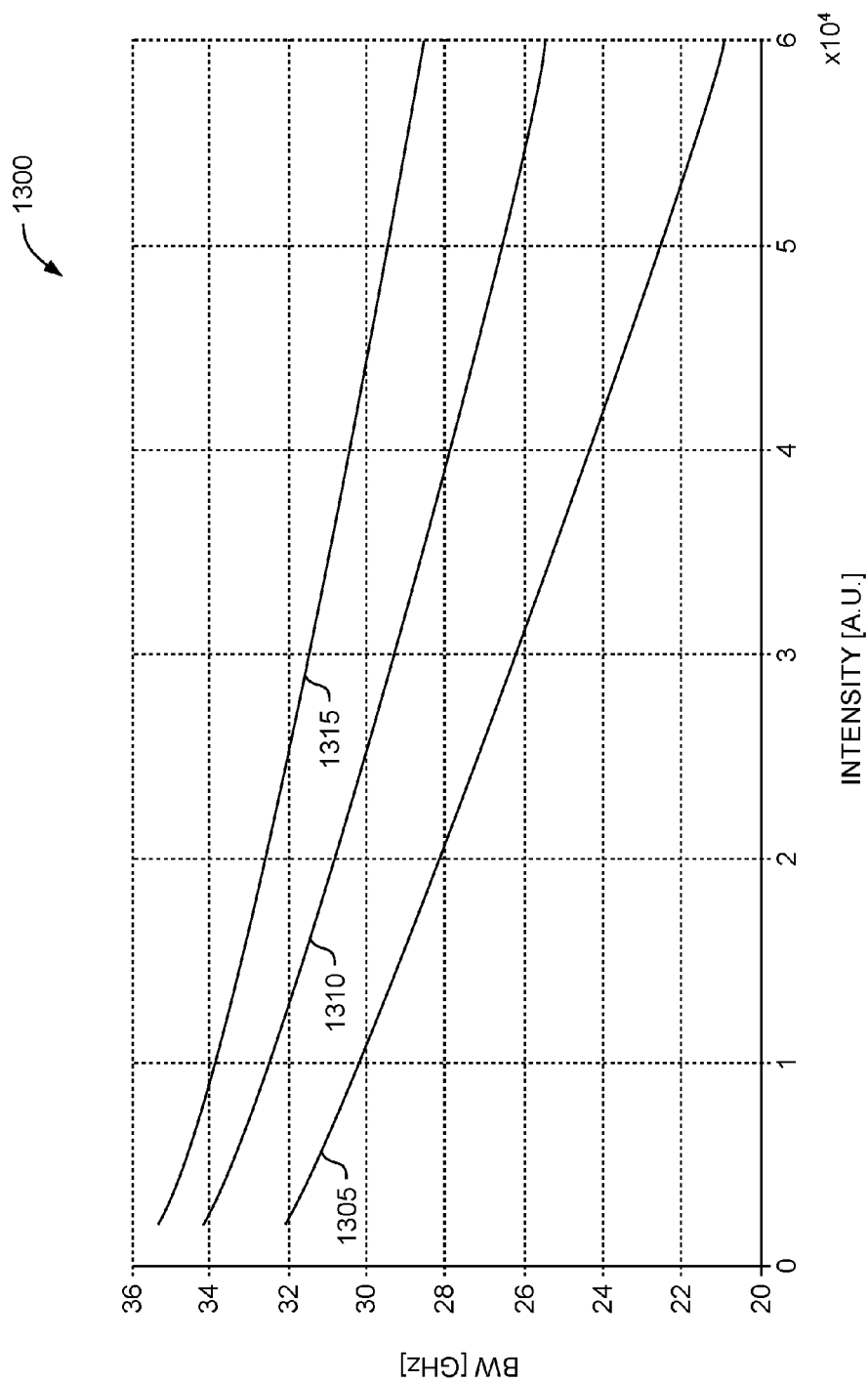
FIG. 13 is a chart illustrating the bandwidth response of the optical detector in FIG. 3 relative to photocurrent, according to one embodiment disclosed herein.

FIG. 13 is a chart 1300 illustrating the bandwidth response of the optical detector in FIG. 3 relative to photocurrent, according to one embodiment disclosed herein. The chart 1300 includes three plots which correspond to the bandwidth performance of the optical detector 215 in FIG. 3 as a function of photocurrent. Further, the three plots in chart 1300 are generated using a different number of the input waveguides in the optical detector 215 in FIG. 3. That is, plot 1305 illustrates when only one input waveguide of the optical detector 215 is used, plot 1310 illustrates when two of the four input waveguides of the optical detector 215 is used, and plot 1315 illustrates when all four of the input waveguides are used. The figure shows that an increase in the number of input waveguides increases the bandwidth.

In view of the foregoing, the scope of the present disclosure is determined by the claims that follow.

We claim:

1. An optical detector, comprising:
a crystalline silicon layer comprising a plurality of input silicon waveguides;
germanium contacting the crystalline silicon layer and forming a geometric shape comprising a plurality of corners, wherein each of the plurality of input silicon waveguides optically couples to a respective one of the plurality of corners of the germanium, and wherein each of the plurality of input silicon waveguides is arranged to transmit light in a direction under the germanium that is offset relative to both sides of the germanium forming the respective corner; and
a plurality of electrical contacts contacting the crystalline silicon layer, wherein each one of the plurality of input silicon waveguides is disposed between a respective pair of the plurality of electrical contacts.

2. The optical detector of claim 1, wherein the direction of light transmission under the germanium in the each of the plurality of input silicon waveguides is not perpendicular to either of the sides of the germanium forming the respective corner.

3. The optical detector of claim 1, wherein a center of each of the plurality of input silicon waveguides is aligned with the respective corner of the germanium.

4. The optical detector of claim 1, wherein the crystalline silicon layer comprises at least four input silicon waveguides, wherein each of the at least four input silicon waveguides optically couple to one of the plurality of corners of the germanium.

5. The optical detector of claim 1, further comprising:
a first electrical contact contacting a first surface of the germanium that is opposing a second surface of the germanium contacting the crystalline silicon layer.

6. The optical detector of claim 5, wherein the first electrical contact and the plurality of electrical contacts couple to respective doped regions in the germanium and the crystalline silicon layer to form vertical PIN junctions.

7. The optical detector of claim 1, wherein the respective pair of the plurality of electrical contacts are coupled to differently doped regions in the crystalline silicon layer to form a lateral PIN junction.

8. An optical system, comprising:
a silicon-on-insulator (SOI) structure comprising a crystalline silicon layer, wherein the crystalline silicon layer comprises a plurality of input silicon waveguides;
germanium contacting the crystalline silicon layer and forming a geometric shape comprising a plurality of corners, wherein each of the plurality of input silicon waveguides optically couples to a respective one of the plurality of corners of the germanium, and wherein each of the plurality of input silicon waveguides is arranged to transmit light in a direction under the germanium that is offset relative to both sides of the germanium forming the respective corner; and
a plurality of electrical contacts contacting the crystalline silicon layer, wherein each one of the plurality of input silicon waveguides is disposed between a respective pair of the plurality of electrical contacts.

9. The optical system of claim 8, wherein the direction of light transmission under the germanium in the each of the plurality of input silicon waveguides is not perpendicular to either sides of the germanium forming the respective corner.

10. The optical system of claim 8, wherein a center of each of the plurality of input silicon waveguides is aligned with the respective corner of the germanium.

11. The optical system of claim 8, wherein the crystalline silicon layer comprises at least four input silicon waveguides, wherein each of the at least four input silicon waveguides optically couples to one of the plurality of corners of the germanium.

12. The optical system of claim 8, further comprising a polarization rotator configured to receive an optical signal and rotate transverse magnetic (TM) polarized light in the optical signal to converted transverse electric (TE) polarized light, wherein an output of the polarization rotator is coupled to the plurality of input silicon waveguides.

13. The optical system of claim 12, further comprising two optical splitters configured to two optical output ports of the polarization rotator, wherein outputs of the two optical splitters are coupled to the plurality of input silicon waveguides.

14. The optical system of claim 8, wherein the SOI structure, the germanium, and the plurality of electrical contacts are integrated in a photonic chip.

15. An optical detector, comprising:
a crystalline silicon layer comprising a plurality of input silicon waveguides;
germanium contacting the crystalline silicon layer, wherein the germanium forms a circular shape, and wherein each of the plurality of input silicon waveguides optically coupled to the germanium; and
a plurality of electrical contacts contacting the crystalline silicon layer, wherein each one of the plurality of input silicon waveguides is disposed between a respective pair of the plurality of electrical contacts.

16. The optical detector of claim 15, wherein the plurality of input silicon waveguides optically couples to a curved surface of the germanium.

17. The optical detector of claim 15, wherein the crystalline silicon layer comprises at least four input silicon waveguides, wherein the circular shape is one of a circle and an ellipse.

18. The optical detector of claim 15, further comprising:
a first electrical contact contacting a first surface of the germanium that is opposing a second surface of the germanium contacting the crystalline silicon layer.

19. The optical detector of claim 18, wherein the first electrical contact and the plurality of electrical contacts couple to respective doped regions in the germanium and the crystalline silicon layer to form vertical PIN junctions.

20. The optical detector of claim 15, wherein the respective pair of the plurality of electrical contacts are coupled to differently doped regions in the crystalline silicon layer to form a lateral PIN junction.

* * * * *